(12) United States Patent  
Fukui et al.

(10) Patent No.: US 7,235,917 B2
(45) Date of Patent: Jun. 26, 2007

(54) PIEZOELECTRIC MEMBER ELEMENT AND LIQUID DISCHARGE HEAD COMPRISING ELEMENT THEREOF

(75) Inventors: Tetsuro Fukui, Yokohama (JP); Katsumi Aoki, Yokohama (JP); Takanori Matsuda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 121 days.

(21) Appl. No.: 11/196,260

(22) Filed: Aug. 4, 2005

(65) Prior Publication Data

US 2006/0033404 A1    Feb. 16, 2006

(30) Foreign Application Priority Data

Aug. 10, 2004    (JP)    ............... 2004-233317

(51) Int. Cl.
*H01L 41/08*    (2006.01)

(52) U.S. Cl. ...................... 310/364; 310/324
(58) Field of Classification Search ................ 310/324, 310/328, 364, 365
See application file for complete search history.

(56) References Cited

U.S. PATENT DOCUMENTS

| 6,653,211 | B2 | 11/2003 | Unno et al. |
| 6,705,708 | B2* | 3/2004 | Murai ......................... 347/70 |
| 6,854,832 | B2 | 2/2005 | Matsuda |
| 6,927,084 | B2 | 8/2005 | Fukui et al. |
| 7,042,141 | B2 | 5/2006 | Funakubo et al. |
| 7,045,935 | B2 | 5/2006 | Matsuda et al. |
| 7,053,526 | B2 | 5/2006 | Unno et al. |
| 7,059,711 | B2 | 6/2006 | Aoto et al. |
| 2002/0076875 | A1 | 6/2002 | Wasa et al. |
| 2004/0155559 | A1 | 8/2004 | Ifuku et al. |
| 2005/0127780 | A1 | 6/2005 | Ifuku et al. |
| 2005/0168112 | A1 | 8/2005 | Aoki et al. |
| 2005/0179342 | A1* | 8/2005 | Higuchi et al. ............. 310/324 |
| 2005/0189849 | A1 | 9/2005 | Ifuku et al. |
| 2005/0219793 | A1 | 10/2005 | Matsuda et al. |
| 2006/0012648 | A1 | 1/2006 | Ifuku et al. |
| 2006/0222895 | A1* | 10/2006 | Higuchi et al. ............. 428/701 |
| 2007/0007860 | A1* | 1/2007 | Takabe et al. ............. 310/324 |

FOREIGN PATENT DOCUMENTS

| JP | 2001-80995 |   | 3/2001 |
| JP | 2003-152233 | * | 5/2003 |
| JP | 2003-179278 | * | 6/2003 |
| JP | 2003-179279 |   | 6/2003 |
| JP | 2003-289161 |   | 10/2003 |
| JP | 2004-345939 |   | 12/2004 |
| JP | 2006-080500 | * | 3/2006 |

* cited by examiner

*Primary Examiner*—Thomas M. Dougherty
(74) *Attorney, Agent, or Firm*—Fitzpatrick, Cella, Harper & Scinto

(57) ABSTRACT

A piezoelectric member element including a piezoelectric member layer and a pair of electrode layers sandwiching the piezoelectric member layer, wherein at least three layers, which are directed in a preferential orientation to the (110) plane on the (100) plane of Si, are accumulated and the above described at least three layers include the above described piezoelectric member layer and one of the above described pair of electrode layers.

10 Claims, 6 Drawing Sheets

PIEZOELECTRIC MEMBER ELEMENT AND LIQUID DISCHARGE HEAD COMPRISING ELEMENT THEREOF

BACKGROUND OF THE INVENTION

1. Field of the Invention

The present invention relates to a piezoelectric member (electrostrictive member) element and a liquid discharge head comprising the element (hereinafter, also referred to as "ink-jet head"). In particular, the present invention relates to a piezoelectric member element that can be applied as a sensor, a transducer and an actuator, etc. In particular the present invention is preferable to MEMS elements and ink-jet heads that have been attracting attention in recent years. In addition, other than ink-jet devices, the present invention is applied to head for memory, optical shutter, etc., ultrasonic motor, speaker, and the like.

2. Related Background Art

As piezoelectric member element, in recent years, taking utilization of semiconductor process into consideration, the one with an element being produced on an Si substrate is developed. Therefore, methods of forming thin film such as sol-gel method, sputtering method, MO-CVD method and the like are being considered. In addition, in order to improve characteristics for piezoelectric member element, consideration on improvement of crystal properties of piezoelectric member film is being implemented as well.

In particular, it has been announced that directing piezoelectric member film such as PZT, etc. to (001) preferential orientation or (111) preferential orientation with an Si substrate having general-purpose (100) surface.

In addition, as piezoelectric member film, films directed to (110) preferential orientation are being considered, but in order to place a piezoelectric member film under crystal control to bring it into film forming onto an Si substrate, high temperature process under 700° C. or more will become necessary.

For example, those having utilized piezoelectric member film in (110) preferential orientation and described in Japanese Patent Application Laid-Open No. 2001-80995 and Japanese Patent Application Laid-Open No. 2003-179279 are known.

A piezoelectric member element described in Japanese Patent Application Laid-Open No. 2001-80995 is the one having used an Si substrate having (110) surface, and a method of laminating (110) preferential orientation onto the (110) surface, and, as in the prior art, a high temperature step will become necessary. Therefore, stress is left in the film to give rise to a problem in endurance.

In addition, a piezoelectric member element described in Japanese Patent Application Laid-Open No. 2003-179279 brings a buffer layer (YSZ, etc.) in (100) preferential orientation into film forming onto an Si substrate having (100) surface, and thereafter places it under crystal control to (110) in an electrode layer, but a high temperature step will become necessary to implement film forming of buffer layer as well to give rise to a problem as in case of piezoelectric member element described in Japanese Patent Application Laid-Open No. 2001-80995. In particular, in case of having utilized, as a vibration plate, a buffer layer to an ink-jet head, problems such as cracks in vibration plate, and delamination between an electrode layer and a buffer layer take place presumably due to influence of residual stress.

SUMMARY OF THE INVENTION

An object of the present invention is to provide a piezoelectric member element including a piezoelectric member layer and a pair of electrode layers sandwiching the piezoelectric member layer, wherein at least three layers, which are directed in a preferential orientation to the (110) plane on the (100) plane of Si, are accumulated and the above described at least three layers include the above described piezoelectric member layer and one of the above described pair of electrode layers.

In addition, the present invention is to provide a piezoelectric member layer in (110) preferential orientation or in single axis orientation on an Si substrate having (100) surface or a piezoelectric member layer of (110) epitaxial film. In addition, the present invention relates to a method of manufacturing method capable of bringing these piezoelectric member layers into film forming, a piezoelectric member element as well as ink-jet head derived therefrom.

In particular, the present invention is capable of setting film forming temperature at a low temperature and of deriving a piezoelectric member element as well as ink-jet head with reduced stress and good properties.

The piezoelectric member element has at least three layers or more directed in a preferential orientation to the (110) plane on the (100) surface of an Si substrate, and therefore is capable of setting film forming temperature at a low temperature and of deriving a piezoelectric member element without occurrence of cracks in vibration plate due to influence of residual stress, etc., and delamination between an electrode layer and a buffer layer. In addition, the present invention is capable of deriving a piezoelectric member element as well as ink-jet head with reduced stress and good properties.

DESCRIPTION OF THE PREFERRED EMBODIMENTS

Figure 1:
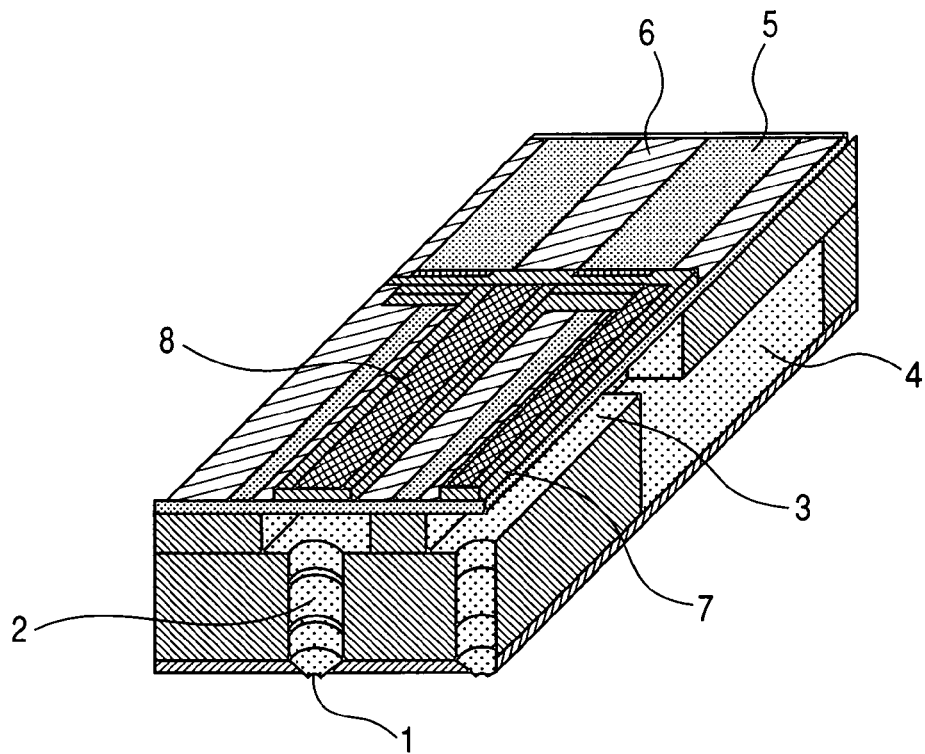
FIG. 1 is a schematic diagram of an ink-jet head related to the present invention.

A piezoelectric member element of the present invention will be described. The present invention is a piezoelectric member element having at least three or more layers of functional layers in the (110) preferential orientation on the (100) surface of an Si substrate. In addition, the above described functional layer is a piezoelectric member element in forms of a buffer layer, an electrode layer and a piezoelectric member layer. In particular, the element does not differ in orientation between the buffer layer and the electrode, and does not give rise to problems such as delamination of electrode, etc. and is excellent in endurance.

In the present invention, "preferential orientation" means an epitaxial orientation to prioritize a (110) plane to be orientated approximately in parallel to a substrate plane with the plane being in single axis orientation at random inside the plane or the plane being also orientated inside the plane. Here, orientation is measured with X-ray diffraction method.

In addition, the piezoelectric member element of the present invention having, on a (100) surface of an Si substrate, at least a fluorite-type oxide layer in a (110) preferential orientation, an electrode layer in a (110) preferential orientation and a piezoelectric member layer in a (110) preferential orientation.

In particular, the layer to become the buffer layer is preferably a fluorite-type oxide. In addition, the piezoelectric member element has two or more layers as for the electrode layer, with at least one layer within those layers being an electrically conductive layer of perovskite-type oxide.

In addition, the piezoelectric member layer may preferably contain a pseudo cubic crystal system. In addition, at least two or more kinds selected from a group consisting of a pseudo cubic crystal system, a rhombohedral crystal system and a tetragonal crystal system.

The piezoelectric member layer is preferably an $ABO_3$ type perovskite oxide. The piezoelectric member film of the present invention means a piezoelectric member film and/or an electrostrictive film. As a material to be used for a piezoelectric member film, perovskite-type compounds are nominated. For example, the piezoelectric material is lead zirconate titanate PZT[$Pb(Zr_xTi_{1-x})O_3$], barium titanate $BaTiO_3$ and the like and the electrostrictive material is a Relaxa system material. MPB (morphotropic phase boundary) composition of lead zirconate titanate (PZT) with x from 0.45 to 0.65 is preferable, but other composition proportions will do.

As electrostrictive material used in the present invention, the following compositions can be selected. For example, PMN[$Pb(Mg_xNb_{1-x})O_3$], PNN[$Pb(Nb_xNi_{1-x})O_3$], PSN[$Pb(Sc_xNb_{1-x})O_3$], PZN[$Pb(Zn_xNb_{1-x})O_3$], PMN-PT$\{(1-y)[Pb(Mg_xNb_{1-x})O_3]-y[PbTiO_3]\}$, PSN-PT$\{(1-y)[Pb(Sc_xNb_{1-x})O_3]-y[PbTiO_3]\}$, PZN-PT$\{(1-y)[Pb(Zn_xNb_{1-x})O_3]-y[PbTiO_3]\}$, LN[$LiNbO_3$] and KN[$KNbO_3$] are nominated. Here, x and y are figures of not more than 1 and not less than 0. For example, in case of PMN, x is 0.2 to 0.5 and for PSN, x is preferably 0.4 to 0.7, and y of PMN-PT is 0.2 to 0.4 and y of PSN-PT is 0.35 to 0.5 and y of PZN-PT of 0.03 to 0.35 is preferable. In addition, PMN-PZT, PZN-PZT, PNN-PZT, PSN-PZT compounds containing Zr configured by replacing Ti in PMN-PT, PZN-PT, PNN-PT and PSN-PT will work. Preferably, in order not to lower the Curie temperature, Zr had better not be contained.

A piezoelectric member film may be a single composition or may be a combination of 2 types or more. In addition, it may be a composition with the above described main component having undergone doping of a tiny amount of elements. The piezoelectric electrostrictive film in the present invention subject to crystal control is good in order to express an excellent piezoelectric property, and the one with a (110) orientation in a crystal configuration being 50% or more in terms of X-ray diffraction is preferable and moreover the one with 90% or more is more preferable.

The above-described configurations can derive a piezoelectric member layer in a (110) preferential orientation with good orientation properties. In addition, a substrate of the present invention is a substrate having preferably an Si layer of plane orientation being (100) plane/an oxide layer/an Si layer of plane orientation being (110) plane other than an Si substrate having a (100) surface (an Si substrate of plane orientation being (100) plane) (in this case, the functional layer is provided on an Si layer of plane orientation being (100) plane).

In addition, the present invention is an ink-jet head having the above described piezoelectric member element. In addition, a manufacturing method of the present invention is a method of manufacturing a piezoelectric member element having a step of forming, on (100) surface of an Si substrate, a fluorite-type oxide layer in a (110) preferential orientation, a step of forming an electrode layer in a (110) preferential orientation and a step of forming a piezoelectric member layer in a (110) preferential orientation.

In particular, the manufacturing method is featured by the forming operation under the substrate temperature of not less than 100° C. and not more than 400° C. in the step of forming the fluorite-type oxide layer of the buffer layer. This can derive a film in a (110) preferential orientation, and can derive an element with less stress inside the film without giving rise to problems such as delamination, etc. In addition, the present invention is a manufacturing method preferably using, as a substrate, an Si layer of plane orientation being (100) plane/an oxide layer/an Si layer of plane orientation being (110) plane. Here, the Si layer of plane orientation being (110) plane may be a portion undergoing machining/processing at the time of devising as a piezoelectric member element.

The piezoelectric member element will be described in detail. The electrode layer in a (110) preferential orientation being a functional layer provided as a piezoelectric member element of the present invention may be either a lower electrode or an upper electrode. As for the order of laminating the functional layers, from the substrate, the buffer layer, the electrode layer and the piezoelectric member layer in this order are accumulated, but in the case where the electrode layer become the upper electrode, not this order but the order of piezoelectric member layer, the electrode layer and the buffer layer will be taken. As for preferable thickness of these functional layers, the buffer layer is set at 0.01 μm to 0.5 μm, the piezoelectric member layer is set at 0.5 μm to 15 μm and the electrode layer is set at 0.1 μm to 0.5 μm. In addition, the buffer layer is preferably a layer containing fluorite-type oxide. A fluorite-type oxide is, for example, $AmO_2$, $CeO_2$, $CmO_2$, $K_2O$, $Li_2O$, $Na_2O$, $NpO_2$, $PaO_2$, $PuO_2$, $RbO_2$, $TbO_2$, $ThO_2$, $UO_2$ and $ZrO_2$, and preferably is $CeO_2$ and $ZrO_2$, which are in a (110) preferential orientation. $ZrO_2$ may be those containing rear-earth metal elements as a dopant. Selecting a fluorite-type oxide, film forming under low temperature of 500° C. or less, preferably 400° C. or less, can derive a film in a (110) preferential orientation on the (100) surface of an Si substrate.

The electrode layer is preferably a double-layer configuration, and at least one layer thereof is preferably a perovskite-type oxide layer. The oxide layer is preferably disposed in the piezoelectric member layer side. In addition, as the electrode material besides oxides, metal materials, that is, materials of a face-centered crystal system, a body-centered crystal system and a hexagonal close-packed structure may be used. A face-centered crystal system is preferable.

The metal materials to become face-centered crystal are, for example, Ni, Pt, Pb, Ir, Cu, Al, Ag, γ-Fe and the like. Pt and Ir are preferable. This metal layer can be utilized, at the time of devising, as an etching stop layer for etching and the like.

In order to improve crystal properties of the piezoelectric member layer, the perovskite-type oxide electrically conductive layer of the electrode layer is preferably an oxide of a $(Sr_xCa_yBa_z)RuO_3$ (here, x+y+z=1) system or a perovskite-type oxide with La existing in the A site.

As an oxide including La in the A site, for example, $LaMoO_3$, $LaCoO_3$, $LaCrO_3$, $LaAlO_3$, $LaSrCoO_3$, $LaCuO_3$, $LaSrMnO_3$, $CaLaMnO_3$, $LaCaRhO_3$, $LaSrRhO_3$, $LaBaRhO_3$, $LaNiO_3$ and the like can be nominated.

Composition of these perovskite-type compounds including the piezoelectric member layer are expressed as $ABO_3$, and the composition does not need to be 1:1:3 exactly but the case with discrepancy within such a range that will not harm the properties will fall within the range of the present invention as well. For example, in terms of oxygen, the electrically conductive layer of a perovskite-type oxide may be oxygen-poor within the range not to give rise to a big problem to the electrically conductive feature as well as the crystal feature, and the piezoelectric member layer may be rich in A-site element for the purpose of improvement of features. The range of composition discrepancy is not limited in particular, and, for example, the phenomena giving rise to discrepancy within the range of ±10% is within a tolerant range, which nevertheless depends on production methods.

The present invention has shown the case of the functional layers in a (110) preferential orientation, but in case of crystal configuration being a tetragonal crystal system, the functional layers includes cases in a (101) preferential orientation and in a (011) preferential orientation as well. In particular, a fluorite-type oxide is a cubic crystal system but may adopt, under the film forming condition of sputter film forming, a tetragonal configuration with the c axis having been extended.

Figure 2:
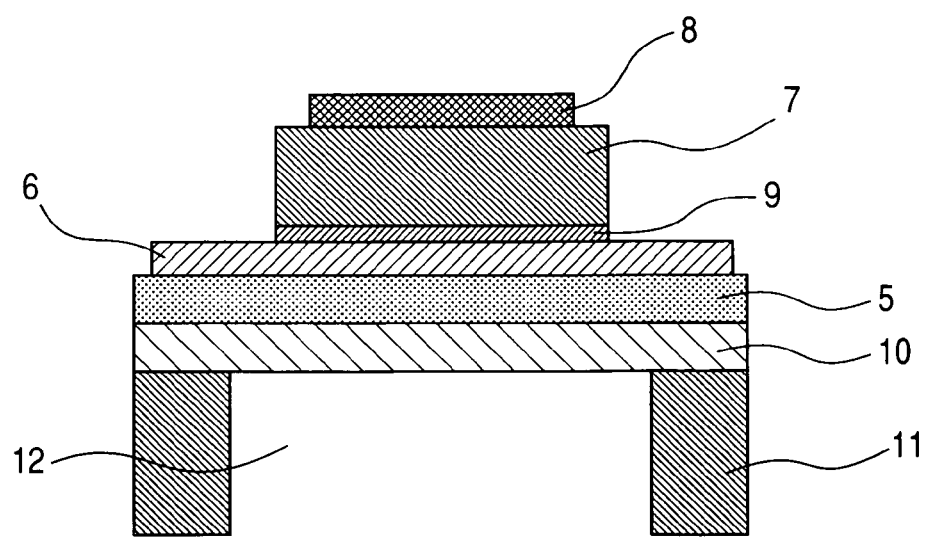
FIG. 2 is a sectional view of a piezoelectric member element related to the present invention.

The present invention is an ink-jet head featured by having the above described piezoelectric member element. The ink-jet head of the present invention has the above described piezoelectric member element, which, therefore, can derive a head with good endurance and stable performance is obtainable. The ink-jet head of the present invention will be described with reference to FIG. 1 and FIG. 2. FIG. 1 is a schematic view of an ink-jet head, and reference numeral 1 denotes a discharge port, reference numeral 2 denotes a communication hole to bring an individual liquid chamber 3 and the discharge port 1 into communication, reference numeral 4 denotes a common liquid chamber, reference numeral 5 denotes a vibration plate, reference numeral 6 denotes a lower electrode, reference numeral 7 denotes a piezoelectric member layer and reference numeral 8 denotes an upper electrode. The piezoelectric member film under reference numeral 7 is shaped rectangular as depicted. This shape may be oval, circular, parallelogram and the like besides rectangle. The piezoelectric member film 7 will be described in further detail with reference to FIG. 2. FIG. 2 is a sectional view of the piezoelectric member film in FIG. 1 in the direction of width. In the drawing, reference numeral 11 denotes a substrate and reference numeral 5 denotes an Si layer having a (100) surface. Reference numeral 6 denotes a buffer layer having undergone (110) preferential orientation. Reference numeral 9 denotes an electrode layer in a (110) preferential orientation, reference numeral 7 denotes a piezoelectric member layer in a (110) preferential orientation and reference numeral 8 denotes an upper electrode.

In the ink-jet head, the layers 5 and 6 function as vibration plates. The electrode under the reference numeral 9 is depicted subject to patterning as in the piezoelectric member layer, but may be a uniform solid film likewise the buffer layer. In addition, on the contrary, the buffer layer 6 may be a structure having undergone patterning likewise the electrode layer. The electrode layer 9 is preferably a double-layer configuration, and preferably the piezoelectric member element side is a perovskite-type oxide layer while the buffer layer side is a metal layer. In that case, preferably the metal layer is a solid film without having undergone patterning while the oxide layer is shaped likewise the piezoelectric member layer subject to patterning. The sectional shape of the layer 7 is depicted in a rectangle, but a trapezoid or an inverted trapezoid is allowable as well. In addition, the configuration order of the layer 8 and the layers 9 and 6 may be upside down. That is, as the upper electrode the layer 9 comes on the piezoelectric member layer 9, and the layer 7 (piezoelectric member film), the layer 9 (electrode layer) and the layer 6 (buffer layer) may be configured in this order. In addition, in this case, the elements may lack the buffer layer under reference numeral 6. The reason why the configuration is reversed is based on the manufacturing method of devising, and even the opposite case can derive the effect of the present invention as well.

The electrode layer 9 to become the lower electrode is pulled out to the portion where the piezoelectric member film 7 does not exist while the upper electrode 8 is pulled out to the (now shown) opposite side of the lower electrode and is connected to a drive power.

A preferable layer configuration except the piezoelectric member layer of the present invention will be exemplified as follows. The brackets represent preferential orientations of crystal. In addition, each layer is provided on the (100) surface of the Si substrate.

(1) $SrRuO_3$ (110)/Pt (110)/$CeO_2$ (110)/Si
(2) $SrRuO_3$ (110)/Ir (110)/$CeO_2$ (110)/YSZ (110)/Si
(3) $CaRuO_3$ (110)/Pt (110)/$CeO_2$ (110)/Si
(4) $LaNiO_3$ (110)/Ir (110)/$CeO_2$ (110)/Si
(5) $CaRuO_3$ (110)/Ir (110)/$CeO_2$ (110)/$ZrO_2$ (110)/Si
(6) $LaSrCoO_3$ (110)/Ru (110)/$CeO_2$ (110)/Si
(7) $LaSrCoO_3$ (110)/Pt (110)/$CeO_2$ (110)/Si
(8) $SrRuO_3$ (100)/$CeO_2$ (110)/YSZ (110)/Si

Among the above described configurations, configurations (1), (2) and (7) are particularly preferable. An Si layer of plane orientation being (110) plane is used as a vibration plate material in the ink-jet head of the present invention, but a lamination member of that layer and the buffer layer or a lamination member of that layer and the buffer layer as well as the electrode layer may be used as the vibration plate.

Thickness of the vibration plate 5 in the ink-jet head of the present invention is 0.5 to 10 μm and preferably 1.0 to 6.0 μm. In addition, thickness of the electrode is 0.05 to 0.6 μm and preferably 0.08 to 0.3 μm. The film thickness of the buffer layer is 5 nm to 450 nm and preferably 10 nm to 200 nm. The above described film thickness will make crystal properties retainable in a good state and will better crystal properties of the piezoelectric member layer as well. The film thickness of the electrode layer in a (110) preferential orientation is 50 nm to 650 nm and preferably 80 nm to 400 nm.

Figure 3:
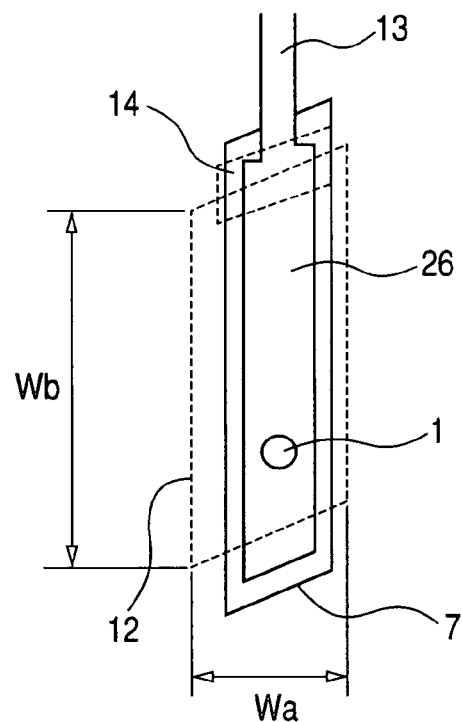
FIG. 3 is a plan diagram of an individual liquid chamber related to the present invention.

FIG. 3 is a plan diagram in view of the individual liquid chamber of the ink-jet head from the piezoelectric member layer side. The width Wa of the individual liquid chamber 12 is 30 to 180 μm. The length Wb (see FIG. 3), which depends on discharge liquid droplet quantity, is 0.3 to 6.0 mm. The shape of the discharge port 1 existing on the opposite surface is circular or a star, and diameter of 7 to 40 µm is preferable. As for the sectional shape of the discharge port, a tapering shape enlarged to the direction of communication hole 2 is preferable. The length of the communication hole 2 is preferably 0.05 mm to 0.5 mm. The length in excess hereof might lessen the discharge speed of liquid droplets. In addition, the length less than this might make larger the dispersion of the discharge speed of liquid droplets discharged from each discharge port.

Figure 7:
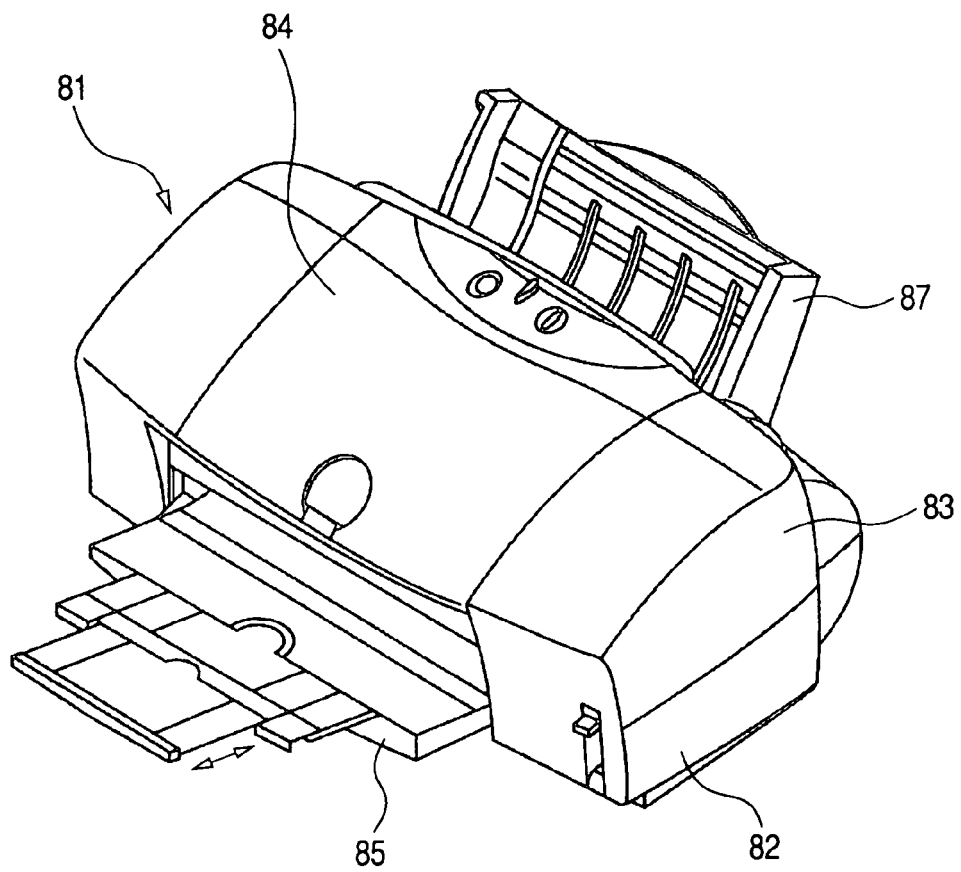
FIG. 7 is a schematic view of an ink-jet recording apparatus related to the present invention.
Figure 8:
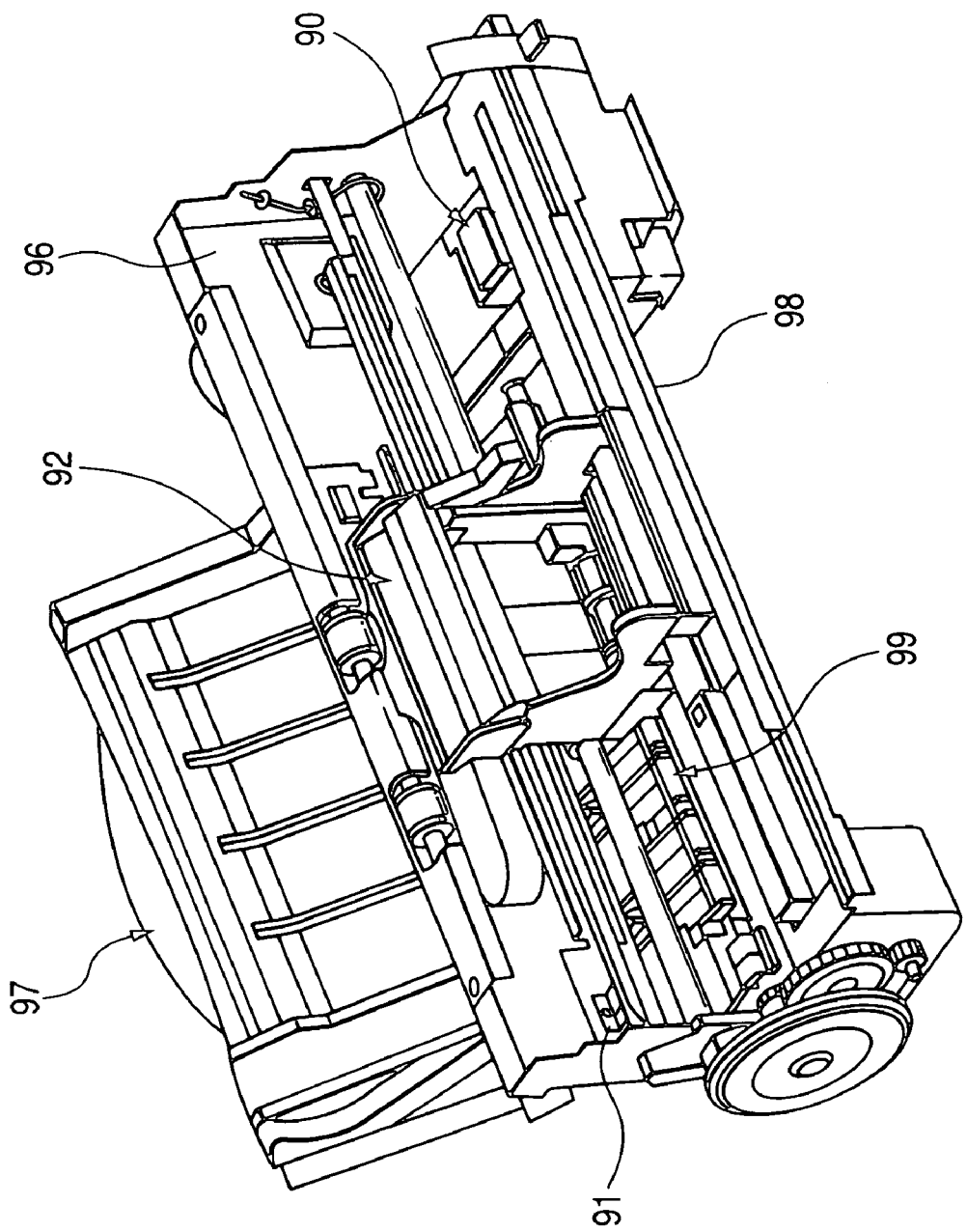
FIG. 8 is a schematic view of an ink-jet recording apparatus related to the present invention subject to removal of the exterior.

In addition, FIG. 7 and FIG. 8 is a schematic view of an ink-jet recording apparatus with the ink-jet head of the present invention. The present invention can stabilize discharge features with these and derives the ink-jet head with long life and can attain the ink-jet head with good performance. The part of operation mechanism subject to removal of the exterior in FIG. 7 is shown in FIG. 8. Configuration includes automatic feeding/conveying part 97 of automatically feeding/conveying recording paper as recording media into the main body of the apparatus, and a conveyance par 99 of leading the discharged recording paper from the automatic feeding/conveying part 97 to a predetermined recording location and leading the recording paper from the recording location to a sheet discharge port, a recording part of implementing recording onto the recording paper conveyed to the recording location and a recovery part 90 of implementing recovery process onto the recording part. The ink-jet head of the present invention is disposed in a carriage 92 and used. FIG. 7 has shown an example as a printer, but the present invention may be used to a Fax, a composite machine, a photocopier and a discharge apparatus for industrial use.

The manufacturing method of the present invention is a manufacturing method of providing, onto the (100) surface of the Si substrate, a piezoelectric member layer having undergone (110) preferential orientation. The manufacturing method includes a step of forming, on a substrate, a fluorite-type oxide layer in a (110) preferential orientation, a step of forming, on the a fluorite-type oxide layer, an electrode layer in a (110) preferential orientation and a step of forming, on the electrode layer, a piezoelectric member layer in a (110) preferential orientation. In particular, the substrate temperature at the time of forming a fluorite-type oxide layer is not less than 100° C. and not more than 400° C., and preferably not less than 100° C. and not more than 350° C.

This will better (110) crystal control properties of the buffer and will make retainable in a good state the properties after the piezoelectric member element has been produced.

Moreover, the manufacturing method of the present invention is a manufacturing method of using a substrate that is a substrate in configuration of an Si layer of plane orientation being (100) plane/an oxide layer/an Si layer of plane orientation being (110) plane. In order to use, as the aforementioned vibration plates (for example, the vibration plate 5 in FIG. 1 and FIG. 2), the Si layer of plane orientation being (100) plane or the Si layer of plane orientation being (110) plane and the oxide layer, those to have the aforementioned film thickness is used. However, in the case where, depending on a process method, the oxide layer does not become a vibration plate on an individual liquid chamber, but is removed with etching and the like, the Si layer is utilized as a vibration plate. The oxide layer is an $SiO_2$ layer or a $B_2O_3$—$SiO_2$ layer and the like, but an oxide other than this will do as well.

The Si layer of plane orientation of the above described substrate being (110) plane undergoes machining with wet etching process so as to be capable of provide an individual liquid chamber suitable to the ink-jet head.

As another aspect of manufacturing method of the present invention, there is a method of forming a layer in a (110) preferential orientation of the present invention onto an Si substrate of plane orientation being (100) plane to transfer an actuator part to a structure member having a vibration plate. Moreover, it may be a method of forming a layer in a (110) preferential orientation of the present invention, forming an electrode layer and a vibration plate and implementing transfer onto another substrate or a substrate which has undergone processing of the individual liquid chamber and the like.

As for the substrate in this case, besides the Si substrate, a substrate such as SUS, INCONEL, Ti foil and Ni foil, etc. with crystal property being at random can be used.

The method of manufacturing the ink-jet head of the present invention may be a method of forming, in a substrate in which the above described piezoelectric member layer is formed, the individual liquid chamber to become a pressure chamber or may be a method of transferring a structure member to become a piezoelectric member element onto another substrate in which an individual liquid chamber has been formed or can be formed separately.

The film forming method of an electrode layer and a dielectric layer includes sputtering, a MO-CVD method, a laser abrasion method, a sol-gel method and an MBE method, etc., and is preferably sputtering, the MO-CVD method and the sol-gel method, and further preferably the MO-CVD method and sputtering. As conditions besides the substrate temperature for the MO-CVD production method, it is preferable to employ a pulse MO-CVD method that does not supply the raw material gas onto the substrate continuously but supplies intermittently.

The method of manufacturing the ink-jet head of the present invention employs two method, namely, a method of providing an individual liquid chamber to become a pressure chamber in the substrate that has been used at the time of bringing the aforementioned dielectric member into film forming and a method of providing another substrate with an individual liquid chamber.

Figure 4:
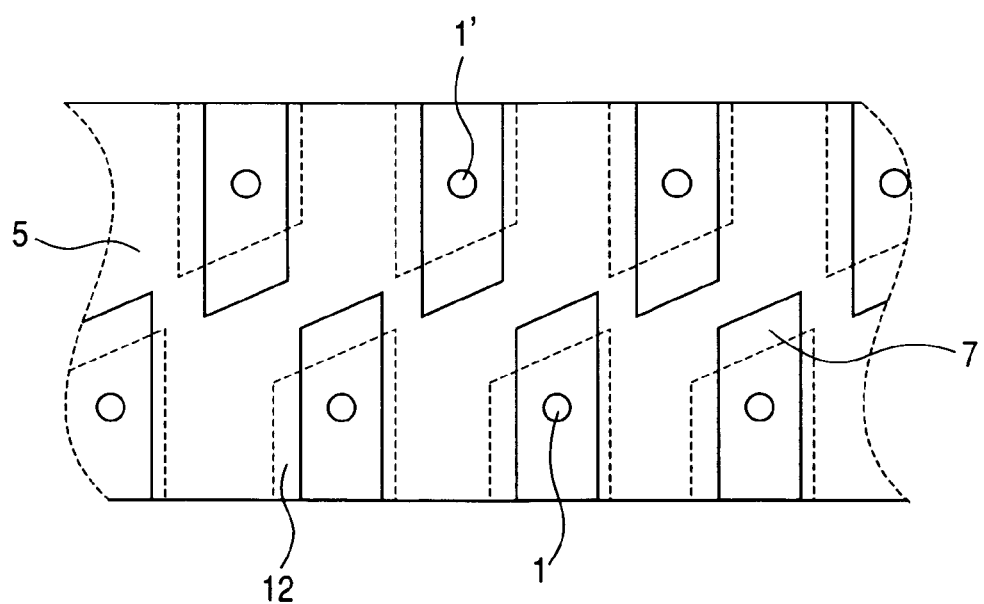
FIG. 4 is a plan diagram of an ink-jet head related to the present invention.

The former method is the same as the above described manufacturing method up to the step of providing a piezoelectric member layer, and is a manufacturing method further includes at least a step of removing a part of the substrate and a step of forming an ink discharge port. Removing a part of the substrate, the individual liquid chamber (reference numeral 3 in FIG. 1 or reference numeral 12 in FIG. 2) is formed. In the manufacturing method, the individual liquid chamber can be manufactured by bringing the substrate into wet etching, dry etching or a sandmill and the like, but preferably undergoes machining of wet etching process onto an Si layer of plane orientation being (110) plane as described above. The individual liquid chamber is made onto the substrate in plurality of a constant pitch number. As shown in FIG. 4 which has depicted a plane disposition of the ink-jet head, the one in which the individual liquid chamber 12 is disposed in the houndstooth arrangement is a preferable aspect. In FIG. 4, the region under reference numeral 12 shown with a broken line is an individual liquid chamber where pressure is applied, and reference numeral 7 denotes a piezoelectric member element part subject to patterning. The piezoelectric member film of this piezoelectric member element part is configured by at least a dielectric layer of the present invention and the upper electrode. Reference numeral 5 denotes the portion of the vibration plate and the lower electrode. The lower electrode is different from the vibration plate, and may be subject to patterning as in FIG. 2. The reason why the shape of the individual liquid chamber is depicted as a parallelogram in FIG. 4 is that such a case of using an Si layer of plane orientation being (110) plane as a substrate, implementing wet etching by alkaline etchant and producing the individual liquid chamber will give rise to a shape like this. The shape of the individual liquid chamber may be rectangular besides this or may be a right square. As in case of a parallelogram as shown in FIG. 4, the piezoelectric member film preferably undergoes patterning to shape a parallelogram in order to shorten the distance between the discharge ports 1 and 1'.

Figure 9:
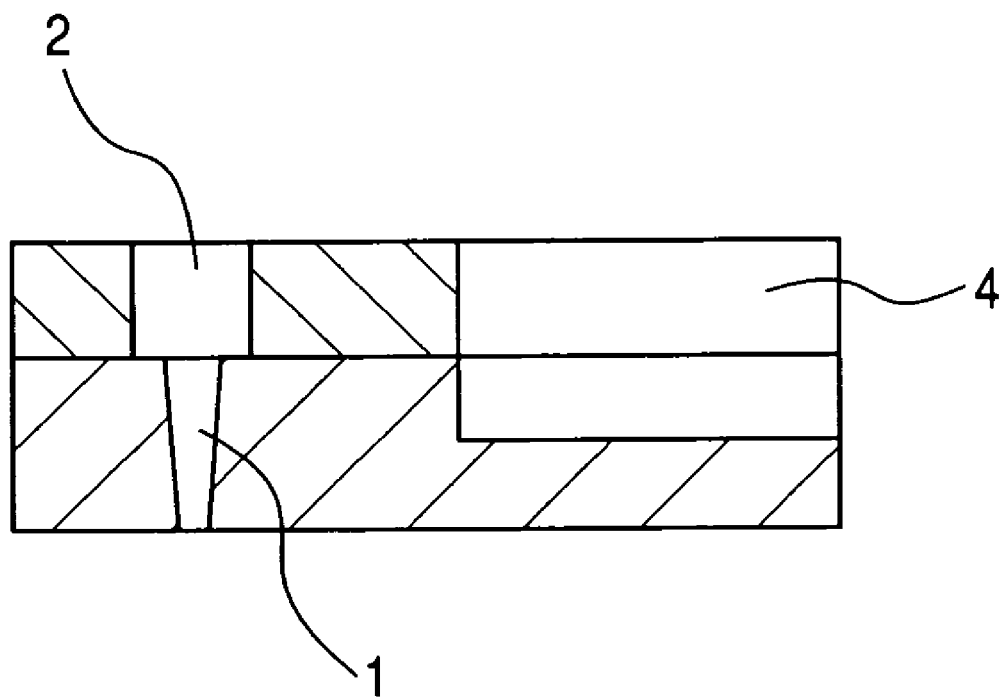
FIG. 9 is a schematic diagram of a liquid discharge portion of ink jet related to the present invention.

The ink discharge port is formed by a method of junctioning the substrate in which the discharge port 1 is provided or junctioning the substrate in which the discharge port 1 and the communication hole 2 is formed. FIG. 9 depicts a schematic diagram of the ink discharge port having been formed like this. In the method of forming the discharge port, the discharge port is formed by etching, machining or laser beam irradiation. The substrate in which the discharge port is formed may be the same as or different from the substrate in which the piezoelectric member film is formed. As the substrate selected in the different case, there are an SUS substrate, an Ni substrate and the like, and such a material that the balance in heat expansion coefficients to the substrate in which the piezoelectric member film is formed is $10^{-6}/°$ C. to $10^{-8}/°$ C. is selected.

The method of junctioning the above described substrate may be a method of using an organic adhesive agent, but a method by way of metal junction with an inorganic material is preferable. A material used for metal junction is In, Au, Cu, Ni, Pb, Ti, Cr, Pd and the like, can implement junction at a low temperature of not more than 300° C. and makes the balance in heat expansion coefficients to the substrate small, avoiding therefore a problem due to warpage of element in case of elongation or otherwise without any damages in the piezoelectric member layer, and is preferable.

Next, a second manufacturing method will be described. The second method is a method of transferring the piezoelectric member layer provided on the first substrate to a second substrate. The method is the same as the aforementioned method up to provision of the piezoelectric member layer, but under the state that the piezoelectric member layer does not undergo patterning, the vibration plate 5 undergoes film forming onto the upper electrode and is transferred to the second substrate.

Or the electrode and/or the vibration plate undergoes film forming onto the piezoelectric member layer, and the vibration plate is junctioned to the second substrate and is transferred including the piezoelectric member layer. Or as aforementioned the piezoelectric member layer undergoes patterning and is transferred to the second substrate in which a vibration plate is provided. For the second substrate, for example, with steps shown in FIG. 5A to FIG. 5F, the individual liquid chamber 12, the communication hole 2 and the common liquid chamber 4 are sequentially formed.

Figures 5D, 5E, 5F:
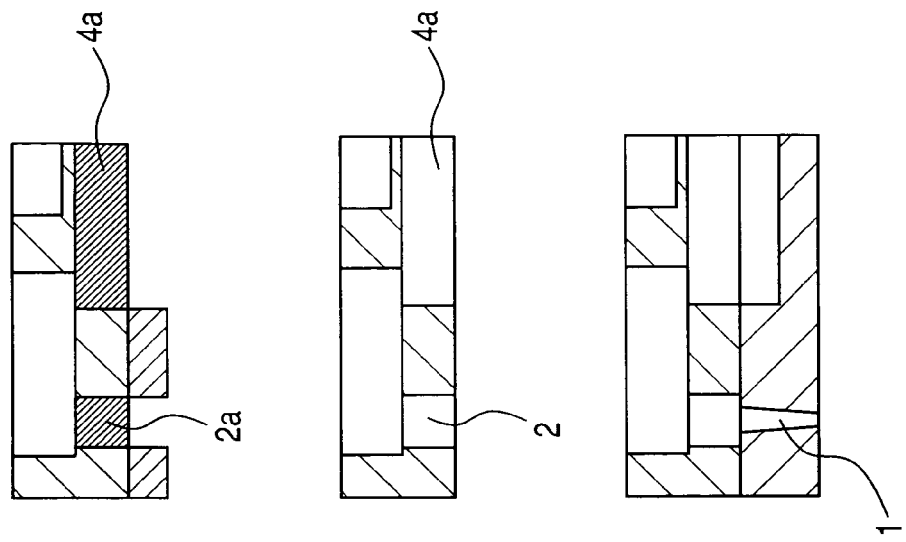
FIGS. 5A, 5B, 5C, 5D, 5E and 5F are schematic diagrams of steps of manufacturing a second substrate of an ink-jet head related to the present invention.
Figures 5A, 5B, 5C:
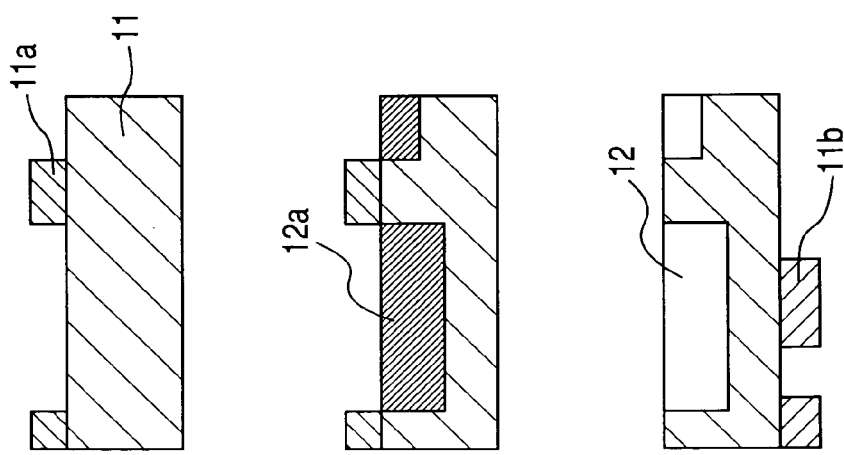

The step in FIG. 5A is a step of having formed a mask 11a corresponding with an individual liquid chamber onto the second substrate 11;

the step in FIG. 5B is a step of implementing processing with etching and the like from the upper part with the mask 11a provided by the step in FIG. 5A as an etching mask to provide the individual liquid chamber 12 (the part with slanted lines 12a means a processing part (individual liquid chamber));

the step in FIG. 5C is a step of removing the mask and a step of producing a mask 11b for the communication hole 2 in the opposite side of the second substrate against the mask the step in FIG. 5A provided;

the step in FIG. 5D is a step of processing the parts with slanted lines 2a and 4a by etching with the mask 11b which the step in FIG. 5C provided as an etching mask to form the communication hole 2 and the common liquid chamber 4; and the step in FIG. 5E shows such a state schematically that the mask formed by the step in FIG. 5C is removed and the individual liquid chamber 12, the communication hole 2 and the common liquid chamber 4 have been formed.

The step in FIG. 5F shows such as state that the discharge port 1 and the substrate in which a part of the common liquid chamber has been formed have been junctioned.

Figure 6:
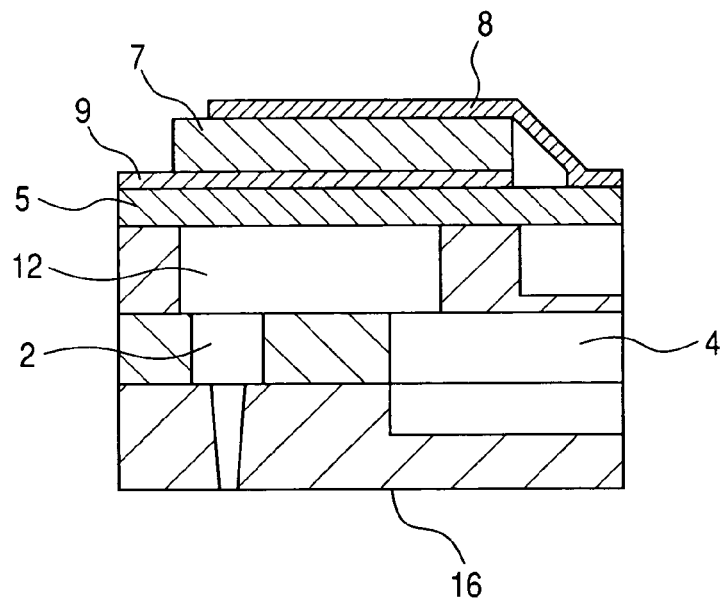
FIG. 6 is a sectional view in the longitudinal direction of an ink-jet head related to the present invention.

FIG. 6 represents an ink-jet head with a functional layer consisting of three layers of an Si layer 5 of plane orientation being (110) plane, a piezoelectric member layer 7 and an upper electrode 8 in the individual liquid chamber side of the one in which the discharge port and the common liquid chamber have been junctioned in the step in FIG. 5F. The substrate surface 16 (in FIG. 6) having the discharge port of the ink-jet head in FIG. 6 preferably has undergone repellent process.

In addition, as described as a part of the latter method, the vibration plate is formed in advance in the second substrate so that a piezoelectric member layer is transferred thereon, and the piezoelectric member in case of removing the first substrate may be or may not be in a state subject to patterning. In case of employing this step, the metal junction layer is preferably utilized as the lower electrode.

As a feature of the method of manufacturing the ink-jet head of the present invention, in the manufacturing steps, the step of removing the patterning of the piezoelectric member layer and/or the first substrate is included, but at that time, in the case where a metal electrode film exists, it can be utilized as an etching stop layer and is step-wise preferable.

In addition, stress of a fluorite-type oxide layer of the buffer layer can be controlled and dealt with so that problems such as cracks, delamination and curving, etc. can be eliminated. Next, the present invention will be described with reference to examples.

Examples will be described as follows. Here, the brackets in the examples represent preferential orientations of crystal.

EXAMPLE 1

At first, an Si layer of plane orientation being (100) plane was formed with 3 μm thickness, and a substrate configured by 2 μm of $B_2O_3$—$SiO_2$ layer as an oxide layer and an Si layer of plane orientation being (110) plane with 625 μm thickness as a handle substrate was prepared. On the Si layer of plane orientation being (100) plane of this substrate, was formed with 50 nm of $CeO_2$ layer underwent film forming with sputtering under the substrate temperature of 250° C. and the gas pressure of 0.5 Pa. The $CeO_2$ layer was in a good (110) preferential orientation. Thereon, Pt (110) and subsequently SRO (110) film respectively of 30 nm and 150 nm thickness were provided under the substrate temperature of 450° C. Moreover, a piezoelectric member film underwent film forming to give rise to 3.5 μm thickness with the composition proportion of $Pb(Zr_{0.60}Ti_{0.40})O_3$ under the substrate temperature of 550° C. This piezoelectric member film was configured by allocation of 95% and more of (110) preferential orientation together with the tetragonal crystal system and the rhombohedral crystal system being commingled.

Thereon, SRO underwent film forming to give rise to 120 nm thickness as an upper electrode, and thereafter, removing the parallelogram part with 60 μm width and 2.2 mm length with etching process from the an Si substrate part of plane orientation being (110) plane, a plurality of pressure chambers were formed in 300 dpi density and the upper electrode and the piezoelectric member layer underwent patterning in correspondence to the above described pressure chambers.

Thereto, an orifice plate having a communication part of bringing nozzles and respective pressure chambers into communication was junctioned to derive an ink-jet head 1 having the piezoelectric member element of the present invention.

EXAMPLE 2

Subject to treatment with fluorinated acid on the surface of the Si layer of plane orientation being (100) plane of the substrate used in Example 1, a $ZrO_2$ layer doped with a group Y element underwent film forming with sputtering production method under the substrate temperature of 300° C. to give rise to 100 nm thickness, and subsequently 60 nm of $CeO_2$ layer underwent film forming under the substrate temperature of 350° C. The both were films in a (110) preferential orientation. Thereon, lamination configuration of SRO/Ir underwent film forming under the substrate temperature of 400° C. (Ir) and 450° C. (SRO) respectively. The both were films in a (110) preferential orientation. Thereon, a PZT film (Zr/Ti proportion=62/38) underwent film forming to give rise to 3.5 μm thickness with sputtering under the substrate temperature of 550° C. As for orientation of the piezoelectric member film, the ratio of orientation was 92% in a film in a (110) preferential orientation, giving rise to a commingled system of the tetragonal crystal system and the rhombohedral crystal system. This underwent processing as in Example 1 to derive an ink-jet head 2.

EXAMPLE 3

With an SOI substrate configured by Si (100) first layer/ $SiO_2$ layer/Si (100) second layer (respective film thickness of 3 μm/1 μm/300 μm), a $CeO_2$ (110) underwent sputtering film forming on the Si (100) first layer of 3 μm under the substrate temperature of 400° C. to give rise to 40 nm thickness. Thereon as electrode layers, 120 nm thickness of Pt (110), 40 nm of $(La,Sr)CoO_3$ (110) and moreover 3.5 μm thickness of $Pb(Zr_{0.55}, Ti_{0.45})O_3$ being a (110) epitaxial film underwent film forming under 600° C. Thereon, a golden upper electrode underwent patterning film forming and, along the upper electrode, the PZT film underwent patterning over the width 47 μm and the length 3 mm. So as to match the location where the PZT is left, the Si second layer side underwent etching removal up to the $SiO_2$ layer with the ICP method to form a plurality of individual liquid chambers 3 with 58 μm width and 2.6 mm length. To this element, an SUS substrate provided with a discharge port as well as ink supply path was junctioned to derive an ink-jet head 3 of the present invention. In addition, a likewise method as described above derived an ink-jet head 4 with an individual liquid chamber in width expanded to 90 μm.

(Assessment)

Subjecting the above described head under the electric field intensity of $1\times10^4$ kV/m and causing to discharge liquid with the coefficient of viscosity of 3.5 cps, properties assessment was implemented. The results thereof were shown in Table 1. Liquid droplet quantity and discharge speed here were converted from liquid droplet sizes and displacement distance given by a high speed camera. In addition, it was confirmed that any of the above described heads is excellent in endurance without significant property deterioration from the initial state even subject to discharge of 108 times or more.

TABLE 1

| INK-JET HEAD | MAXIMUM DRIVE FREQUENCY (kHz) | DISCHARGE SPEED (m/s) | LIQUID DROPLET QUANTITY (pL) |
|---|---|---|---|
| 1 | 60 | 9.5 | 1.9 |
| 2 | 50 | 7.5 | 2.2 |
| 3 | 50 | 8.0 | 1.5 |
| 4 | 50 | 8.0 | 2.9 |

This application claims priority from Japanese Patent Application No. 2004-233317 filed Aug. 10, 2004, which is hereby incorporated by reference herein.

What is claimed is:

1. A piezoelectric member element including a piezoelectric member layer and a pair of electrode layers sandwiching the piezoelectric member layer, wherein at least three layers, which are directed in a preferential orientation to the (110) plane on the (100) plane of Si, are accumulated and said at least three layers include said piezoelectric member layer and one of said pair of electrode layers.

2. The piezoelectric member element according to claim 1, wherein said at least three layers have a buffer layer.

3. The piezoelectric member element according to claim 1, wherein said at least three layers have a fluorite-type oxide layer.

4. The piezoelectric member element according to claim 1, wherein said piezoelectric member layer includes a pseudo cubic crystal system.

5. The piezoelectric member element according to claim 1, wherein said piezoelectric member layer includes at least two or more kinds selected from a group consisting of a pseudo cubic crystal system, a rhombohedral crystal system and a tetragonal crystal system.

6. The piezoelectric member element according to claim 3, wherein said fluorite-type oxide layer includes at least one of $CeO_2$ and $ZrO_2$.

7. The piezoelectric member element according to claim 3, wherein said fluorite-type oxide layer is a fluorite-type oxide layer formed by bringing materials of the fluorite-type oxide layer into heat treatment under not less than 100° C. and not more than 400° C.

8. The piezoelectric member element according to claim 1, wherein one of said pair of electrode layers has a perovskite type oxide electrically conductive layer.

9. The piezoelectric member element according to claim 1, wherein a layer having said Si (100) plane is provided in contact with an oxide layer provided in contact with an Si layer of plane orientation being (110) plane.

10. A liquid discharge head comprising
a piezoelectric member element including a piezoelectric member layer, a pair of electrode layers sandwiching the piezoelectric member layer, and a pressure chamber member in which a pressure chamber is provided in correspondence with the piezoelectric member element and discharging liquid inside said pressure chamber with displacement of said piezoelectric member element,
wherein in said piezoelectric member element, at least three layers, which are directed in a preferential orientation to the (110) plane on the (100) plane of Si, are accumulated and said at least three layers include said piezoelectric member layer and one of said pair of electrode layers.

* * * * *

UNITED STATES PATENT AND TRADEMARK OFFICE
CERTIFICATE OF CORRECTION

PATENT NO. : 7,235,917 B2
APPLICATION NO. : 11/196260
DATED : June 26, 2007
INVENTOR(S) : Fukui et al.

It is certified that error appears in the above-identified patent and that said Letters Patent is hereby corrected as shown below:

ON THE TITLE PAGE:
At Item (57), Abstract, Line 6, "above described" should read --above-described--, and "above" should read --above- --.
At Item (57), Abstract, Line 7, "above" should read --above- --.

COLUMN 1:
Line 14, "particular" should read --particular,--.
Line 30, "electric member film" should read --electric member films--.
Line 61, "as well" should read --as well as--.

COLUMN 2:
Line 8, "above" should read --above- --.
Line 9, "above described" should read --above-described--.
Line 10, "above described" should read --above-described--.
Line 11, "pair" should read --pairs--.
Line 66, "above" should read --above- --.

COLUMN 3:
Line 5, "electrode" should read --an electrode--.
Line 50, "in case" should read --in the case--.
Line 60, "above described" should read --above-described--.

COLUMN 4:
Line 12, "above described" should read --above-described--.
Line 42, "become" should read --becomes--.
Line 53, "rear-earth" should read --rare-earth--.

COLUMN 5:
Line 23, "element" should read --elements--.
Line 30, "in case" should read --in the case--.
Line 32, "includes" should read --include--.
Line 39, "above described" should read --above-described--.
Line 40, "above" should read --above- --.

UNITED STATES PATENT AND TRADEMARK OFFICE
CERTIFICATE OF CORRECTION

PATENT NO. : 7,235,917 B2
APPLICATION NO. : 11/196260
DATED : June 26, 2007
INVENTOR(S) : Fukui et al.

It is certified that error appears in the above-identified patent and that said Letters Patent is hereby corrected as shown below:

COLUMN 6:
Line 44, "above described" should read --above-described--.
Line 56, "above described" should read --above-described--.

COLUMN 7:
Line 10, "is a schematic view" should read --are schematic views--.
Line 64, "above described" should read --above-described--.
Line 66, "provide" should read --providing--.

COLUMN 8:
Line 17, "above described" should read --above-described--.
Line 34, "method," should read --methods,--.
Line 40, "above described" should read --above-described--.
Line 42, "and is" should read --and as--.
Line 54, "FIG. 4" should read --FIG. 4,--.

COLUMN 9:
Line 7, "in case" should read --in the case--.
Line 22, "are" should read --is--.
Line 26, "above described" should read --above-described--.
Line 47, "aforementioned" should read --aforementioned,--.
Line 64, "in the" should read --on the--.

COLUMN 10:
Line 31, "step-wise" should read --stepwise--.
Line 63, "the an" should read --the--.
Line 65, "were" should read --was--.
Line 67, "above described" should read --above-described--.

COLUMN 11:
Line 17, "The both" should read --They both--.
Line 21, "The both" should read --They both--.
Line 50, "as ink" should read --as an ink--.
Line 57, "above described" should read --above-described--.
Line 64, "above described" should read --above-described--.

UNITED STATES PATENT AND TRADEMARK OFFICE
CERTIFICATE OF CORRECTION

PATENT NO. : 7,235,917 B2
APPLICATION NO. : 11/196260
DATED : June 26, 2007
INVENTOR(S) : Fukui et al.

It is certified that error appears in the above-identified patent and that said Letters Patent is hereby corrected as shown below:

COLUMN 12:
Line 46, "perovskite type" should read --perovskite-type--.

Signed and Sealed this

Twenty-fourth Day of February, 2009

JOHN DOLL
*Acting Director of the United States Patent and Trademark Office*